United States Patent
Shitara et al.

(10) Patent No.: US 6,968,165 B2
(45) Date of Patent: Nov. 22, 2005

(54) FREQUENCY SCANNING RECEIVER PERMITTING QUICK PPL SETTING

(75) Inventors: Sadanori Shitara, Tokyo (JP); Kiyoshi Wakui, Tokyo (JP); Nobuaki Yokoyama, Tokyo (JP)

(73) Assignee: General Research of Electronics, Inc., Tokyo (JP)

(*) Notice: Subject to any disclaimer, the term of this patent is extended or adjusted under 35 U.S.C. 154(b) by 367 days.

(21) Appl. No.: 10/127,216

(22) Filed: Apr. 22, 2002

(65) Prior Publication Data

US 2002/0160736 A1 Oct. 31, 2002

(30) Foreign Application Priority Data

Apr. 26, 2001 (JP) .......................... 2001-129062

(51) Int. Cl.[7] ................................. H04B 1/06
(52) U.S. Cl. .................... 455/230; 455/255; 455/161.1; 455/257
(58) Field of Search ................. 455/230, 255, 455/161.1–161.3, 164.1, 164.2, 257, 258–260, 265, 313–316, 180.3, 192.1, 192.2, 226.1, 318, 323, 324, 337, 165.1, 182.1, 182.2, 166.1; 375/324, 327, 362, 365, 371, 344, 373, 375, 376, 326, 130

(56) References Cited

U.S. PATENT DOCUMENTS

| | | | | |
|---|---|---|---|---|
| 4,198,605 A | * | 4/1980 | Yamashita et al. | 455/161.1 |
| 4,919,640 A | * | 4/1990 | Yanagibori | 455/164.1 |
| 5,125,105 A | * | 6/1992 | Kennedy et al. | 455/164.1 |
| 5,493,710 A | * | 2/1996 | Takahara et al. | 455/265 |
| 6,023,491 A | * | 2/2000 | Saka et al. | 455/182.2 |
| 6,038,433 A | * | 3/2000 | Vegt | 455/161.1 |
| 6,069,580 A | * | 5/2000 | Martinson | 455/226.1 |
| 6,335,953 B1 | * | 1/2002 | Sanderford et al. | 375/344 |
| 6,463,266 B1 | * | 10/2002 | Shohara | 455/258 |
| 6,668,025 B1 | * | 12/2003 | Sumi et al. | 375/326 |
| 6,775,317 B1 | * | 8/2004 | Yokota | 375/130 |

OTHER PUBLICATIONS

U.S. Appl. No. 10/139,944, filed May 6, 2002.

* cited by examiner

*Primary Examiner*—Lana Le
(74) *Attorney, Agent, or Firm*—Fynn, Thiel, Boutell & Tanis, P.C.

(57) ABSTRACT

A frequency scanning receiver minimizes the time needed for setting the frequency of a phased lock loop of a first local oscillator. The frequency scanning receiver is configured so that when the reference frequency of the PLL of the first local oscillator has been set at a high frequency, and the frequency error is less than the second IF, the frequency error is controlled to be zero by the control circuit switching the frequency of a second local oscillator or third local oscillator to an appropriate frequency using an output of a frequency discriminator.

8 Claims, 3 Drawing Sheets

FREQUENCY SCANNING RECEIVER PERMITTING QUICK PPL SETTING

CROSS-REFERENCE TO RELATED APPLICATIONS

This application is related to U.S. patent application Ser. No. 10/139,944 filed May 6, 2002 and published as U.S. Pat. Publication No. 2002/0168953 A1.

BACKGROUND OF THE INVENTION

1. Field of the Invention

The present invention relates to a frequency scanning receiver used in the VHF (Very High Frequency) band, UHF (Ultra High Frequency) band or the like, and particularly relates to an improvement of methods of setting a frequency of a local carrier wave for converting a frequency.

2. Description of the Related Art

Radio waves used in the VHF band, usually, are allocated so as to be at the intervals of 15 kHz, and in the UHF band, radio waves are allocated so as to be at the intervals of 12.5 kHz. However, although radio waves are allocated at the intervals of 15 kHz, there are a number of groups of radio waves here and there which do not have any multiple relationship with 15 kHz such that these are not evenly allocated at the intervals of 15 kHz over its whole band. There is a group of some radio waves which are allocated at the intervals of 15 kHz, then, there is another group consisting of some radio waves which are allocated at the intervals of 15 kHz but away from the group at the distance of 20 kHz×N. There are similar circumstances concerning the frequency band at the intervals of 12.5 kHz. Moreover, resulting from the shortness of radio waves (radio resources or radio propagation paths), the 15 kHz interval of the VHF band is shifting to a 7.5 kHz interval and the 12.5 kHz interval of the UHF band is shifting to a 6.25 kHz interval.

In what is called a full wave scanning receiver for covering radio waves at the intervals over such a wide band, a well-known device has a first local oscillator controlled by a PLL (Phase Locked Loop) for channel selection (tuning). Since a frequency signal of an integer-fold of the reference oscillation frequency from the reference oscillator (crystal oscillator) can be output by controlling a dividing ratio of a frequency divider constituting the PLL, a stable scanning first local oscillator can be configured.

However, in the case where it would have been applied, the following inconveniences will occur. Since in the receiver as configured above, only a frequency signal of an integer-fold of the reference frequency can be output, the reference frequency of the first local oscillator is required to set the greatest common divisor of the full receiving frequency (precisely, a frequency as a first local oscillation, but it is similar to a receiving frequency). At the present time, however, radio waves are allocated in miscellaneous arrays of frequency intervals as described above. Therefore, it cannot help to elect an extremely low reference frequency, such as 2.5 kHz, 3.125 kHz or the like. If the reference frequency is lowered, the cut-off frequency of the loop filter of the PLL corresponding to this frequency cannot help but also be lowered. Necessarily, the response of the PLL will be delayed, and it will take a considerable time to set the receiving frequency at the time of channel selection.

SUMMARY OF THE INVENTION

Hence, an object of the present invention is to provide a frequency scanning receiver capable of setting a receiving frequency at the time of channel selection, not requiring the time for setting the reference frequency of a PLL and in a simple circuit configuration.

In order to achieve the object, the present invention provides in one aspect thereof a frequency scanning receiver having a first local oscillator for outputting a first local oscillation signal controlled in frequency by a phase locked loop, a second local oscillator for outputting a second local oscillation signal, and a frequency discriminator so that the frequency of the first local oscillation signal output from the first local oscillator is scanned by frequency setting data fed to the phase locked loop.

The frequency scanning receiver comprises a memory for receiving the frequency setting data and outputting its corresponding one of frequencies preset and stored for second local oscillation signals to be output from the second local oscillator, and a controller for determining a frequency error obtained at an output of the frequency discriminator at the time of a channel selection and updating the frequency setting data for the memory on the basis of results of the determination such that the frequency error is reduced to zero.

In order to achieve the object, the present invention also provides in another aspect thereof a frequency scanning receiver having a first local oscillator for outputting a first local oscillation signal controlled in frequency by a phase locked loop, a second local oscillator for outputting a second local oscillation signal, a third local oscillator for outputting a third local oscillation signal, and a frequency discriminator so that the frequency of the first local oscillation signal output from the first local oscillator is scanned by frequency setting data fed to the phase locked loop.

The frequency scanning receiver includes a memory for receiving the frequency setting data and outputting its corresponding one of preset stored frequencies for third local oscillation signals to be output from the third local oscillator, and a controller for determining a frequency error obtained at an output of the frequency discriminator at the time of a channel selection and updating the frequency setting data for the memory on the basis of results of the determination such that the frequency error is reduced to zero.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention, wherein.

DESCRIPTION OF THE PREFERRED EMBODIMENTS

Figure 1:
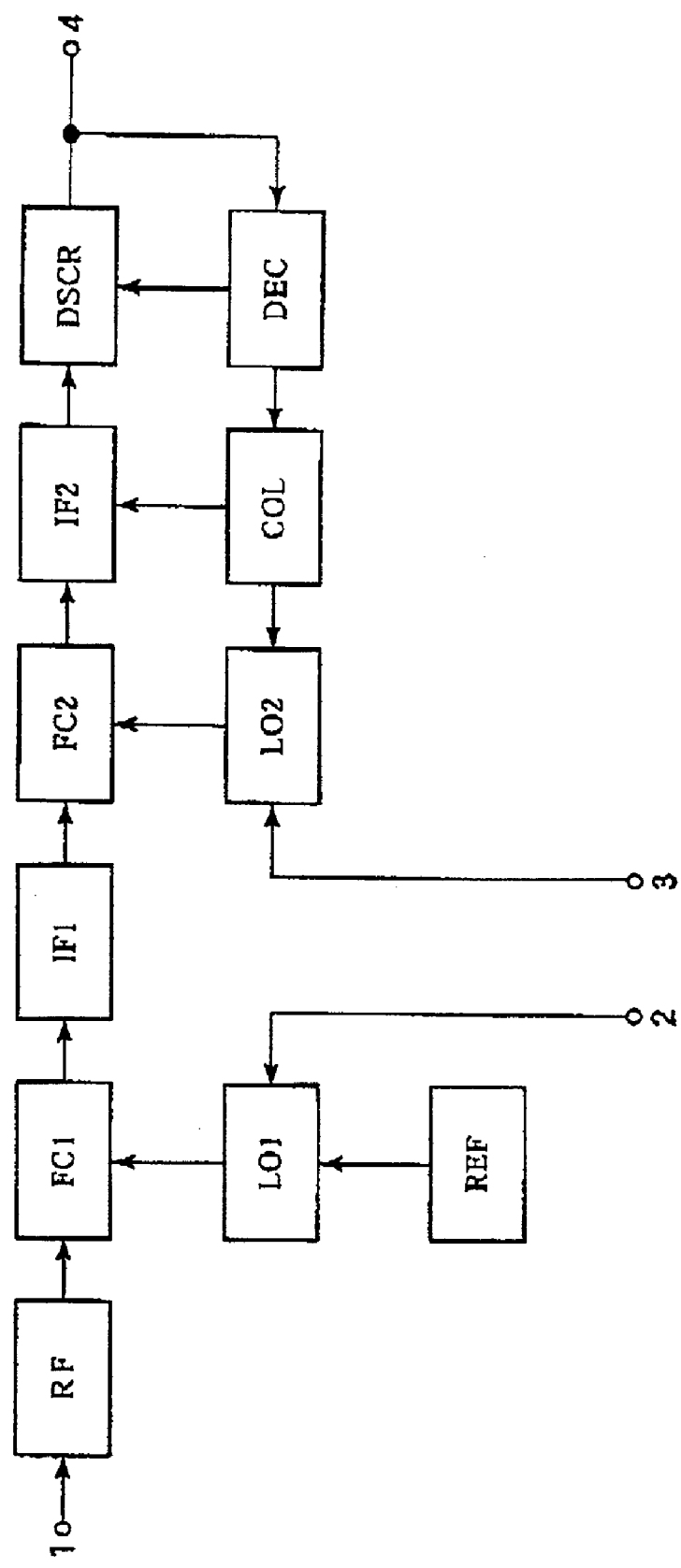
FIG. 1 is a diagram of a circuit configuration showing one embodiment of the present invention.

Although it is better that the reference frequency of a PLL is as high as possible from the viewpoint of the setting time, if the higher frequency is chosen, since the frequency interval of an output carrier wave is widened, by that portion, the number (kinds of errors) of the first IF (first immediate frequency) signal having a frequency error is increased. If a lower frequency is chosen, on the contrary, the number of the kinds of errors decreases, but the problem of the setting time emerges. Hence, now, supposing that the reference frequency is made on the order of 7.5 kHz or 6.25 kHz, and if a radio wave actually used is channel-selected and received, the number of the kinds of error frequencies is about 3 to about 5. If it is selected so that the frequency of the second local oscillator becomes zero with respect to this first IF signal, corresponding to the error frequency, it is to be a correct frequency in the second IF. It is easily understood how large the value of the error frequency is if the frequency discriminator is provided and the output is observed. Therefore, first, the second local oscillator is set at the normal frequency and receives a radio wave and from the magnitude of the output voltage of the frequency discriminator, the error frequencies are discriminated. It may be made so that the output voltage becomes zero by selecting an appropriate frequency from frequencies generated in crystal oscillators for the second local oscillator. If it is such a configuration, the increase of the scale of the circuit is not expected to be so large.

Although according to the configuration described above, a receiver sufficient for both performance and operation can be configured, if the following circuit is further added to this configuration, still more of the operation will be capable of being accelerated. This means that the second local frequency, which has been determined by an output of the frequency discriminator as it should be used, as well as the first local oscillator frequency (it is possible to use frequency setting data of PLL), has previously been set in a memory such as a rewritable ROM (Read Only Memory) or an EEPROM (Electrically Erasable Programmable Read Only Memory). At the time of channel selection, usually, the second local oscillator is set using an output of this ROM. If necessary, the contents of the ROM (setting frequency of the second local oscillator) may be updated using an output of the frequency discriminator. This configuration is capable of being made because the frequency of a radio wave is not frequently changed. According to this configuration, the operation time is shortened by the portion of the response times of the frequency discriminator, determination circuit, switching circuit and the like.

It should be noted that it is also considered that instead of switching a few pieces of crystal oscillators as second local oscillators, an AFC (Automatic Frequency Control) may be configured by controlling a VCO (Voltage Controlled Oscillator) by an output of the frequency discriminator.

One embodiment of a frequency scanning receiver of the present invention will be described using the following drawings. FIG. 1 is a diagram showing a circuit configuration of this embodiment. In FIG. 1, the reference numeral 1 denotes an input terminal for a high frequency signal, the reference sign RF denotes a high frequency amplifier, the reference sign FC1 denotes a first frequency converter, the reference sign LO1 denotes a first local oscillator, the reference sign REF denotes a reference signal generator, the reference numeral 2 denotes a frequency setting signal input terminal, the reference sign IF1 denotes a first intermediate cycle amplifier (first IF amplifier), the reference sign FC2 denotes a second frequency converter, the reference sign LO2 denotes a second local oscillator, the reference numeral 3 denotes a switching signal input terminal of the second local oscillator, the reference sign IF2 denotes a second intermediate cycle amplifier (second IF amplifier), the reference sign DSCR denotes a frequency discriminator, the reference sign DEC denotes a determination circuit, the reference sign COL denotes a control circuit, and the reference numeral 4 denotes a demodulated signal output terminal.

A high frequency signal given to the input terminal 1 at the time of channel selection (tuning) is added to the first frequency converter FC1 through the high frequency amplifier RF, and the frequency is converted to the first IF in the first frequency converter FC1 using the local carrier wave output from the first local oscillator LO1. The first local oscillator LO1 is controlled by PLL described above and outputs a first local carrier wave of the frequency of an integer-fold of the reference frequency (for example, 7.5 kHz) added by the reference signal generator REF. How many integer-fold the frequency is multiplied by the reference frequency is determined by controlling the frequency dividing ratio of the divider within the PLL using a setting signal added by the terminal 2. The signal converted to the first intermediate frequency (first IF) is added to the second frequency converter FC2 through the first IF amplifier IF1, where it becomes a second IF signal using a second local carrier wave output from the second local oscillator LO2. This signal is added to the frequency discriminator DSCR through the second IF amplifier IF2 and demodulated.

Since initially the second local oscillator LO2 is controlled so that a second local carrier wave of the normal frequency is output, in the case where a radio wave having a frequency of an integer-fold of 7.5 kHz (in this case) is received, the output of the frequency discriminator DSCR is zero because there is no frequency error. However, as described above, since there are radio waves having a frequency of +2.5 kHz or −2.5 kHz or the like deviated from the frequency of an integer-fold of 7.5 kHz, when these radio waves are received at the time of channel selection, the frequency discriminator DSCR generates a positive or negative output corresponding to this deviation. Therefore, the determination circuit DEC determines these frequency errors and the control circuit COL controls the frequency error by switching the frequency of the second local oscillator LO2 to an appropriate frequency so that the frequency error (DSCR output) becomes zero.

Figure 2:
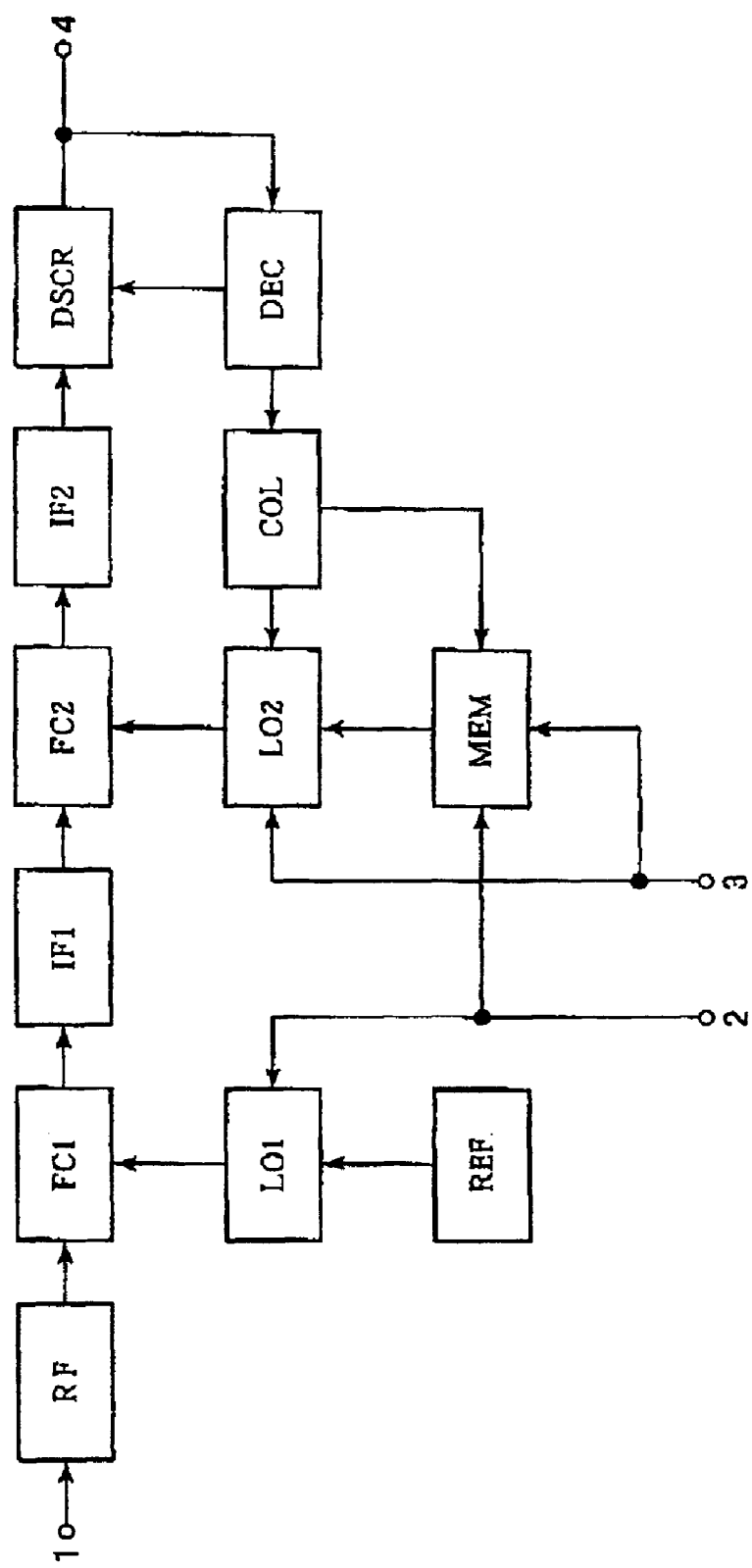
FIG. 2 is a diagram of a circuit configuration showing another embodiment of the present invention.

FIG. 2 illustrates another embodiment of the present invention. To the circuit shown in FIG. 1, a rewritable memory MEM has been added so that it is no longer necessary to reset the frequency for the second local oscillation signal, which is to be output from the second local oscillator LO2, every time a channel is selected. Specifically, when frequency setting data of the PLL is fed to the terminal 2, the rewritable memory MEM usually makes use of the frequency setting data as an address input, and outputs a preset frequency for a second local oscillation signal so that the control circuit COL sets at an appropriate frequency, the frequency for a second local oscillation signal to be output from the second local oscillator LO2. When the frequency setting data of the PLL is fed from the first local oscillator LO1, the frequency for the second local oscillation signal to be output from the second local oscillator LO2 is set earlier in time than the frequency for the first local oscillation signal to be output from the first local oscillator LO1. The contents of the memory MEM are updated by an output from the determination circuit DEC as needed. A terminal 3 is an input terminal for a control signal, which controls whether the setting of the frequency for the second local oscillation signal to be output from the second local oscillator LO2 should be performed by an output of the determination circuit DEC, or by an output of the memory MEM and also whether or not the contents of the memory should be updated.

Figure 3:
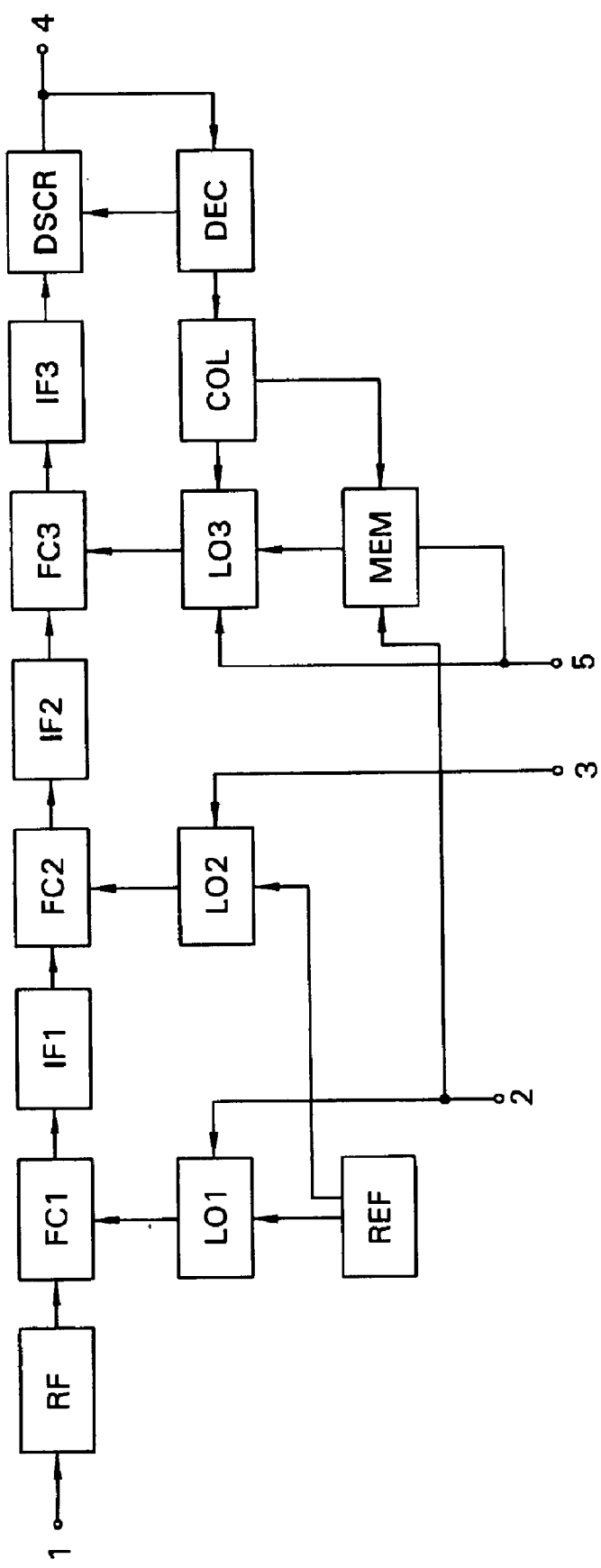
FIG. 3 is a diagram of a circuit configuration showing a further embodiment of the present invention.

FIG. 3. illustrates a further embodiment of the present invention. FIG. 3 is different from FIG. 2 in that the second frequency converter FC2, second local oscillator LO2 and second intermediate cycle amplifier IF2 in the circuit shown in FIG. 2 have been changed to a third frequency converter FC3, third local oscillator LO3 (Nth local oscillator) and third intermediate cycle amplifier IF3, respectively. Further between the first intermediate cycle amplifier IF1 in the circuit shown in FIG. 2 and the second frequency converter FC2 in the circuit shown in FIG. 2 (i.e., the third frequency converter shown in FIG. 3) in the circuit shown in FIG. 2, a second frequency converter FC2, second local oscillator LO2 and second intermediate cycle amplifier IF2 have been added to use the memory MEM for setting a frequency for a third local oscillation signal to be output from the third local oscillator LO3. In this case, the second local oscillator LO2 generates a second local oscillation signal, and the third local oscillator LO3 generates a third local oscillation signal. This embodiment is different from the embodiment of FIG. 2 only in the addition of an operation step that a received signal is converted in frequency into a third intermediate cycle signal via a second intermediate cycle signal.

Further, a separate terminal 5 supplies the control signal to the memory MEM and the third local oscillator LO3. This arrangement is effectively the same as the arrangement of input terminal 3 in FIG. 2. Basically speaking, the setting of a frequency for a third local oscillation signal to be output from the third local oscillator LO3 is performed in a similar manner as the setting of a frequency for a local oscillation signal to be output from the final-stage local oscillator in the circuit shown in FIG. 2, that is, the setting of a frequency for a second local oscillation signal to be output from the second local oscillator LO2.

The Nth local oscillator (N represents a positive integer) comprises the third oscillator in the embodiment of FIG. 3. In other embodiments, the Nth oscillator can be a fourth, fifth, or sixth oscillator, etc.

As described above in detail, in the case where radio waves of the VHF and UHF bands are received and channel-selected by a frequency scanning receiver using a first local oscillator by means of a PLL, the reference frequency of the PLL of the first local oscillator is required to be selected so as to be the greatest common divisor for all of the frequencies within the covering range. However, since all of the actual radio waves are not allocated in equal intervals, it cannot help necessarily selecting lower reference frequencies. As a result of this, time is required for setting the PLL. However, according to the present invention, since the PLL can be designed as the frequencies of the received radio waves being allocated at an equal interval, the reference frequency can be set at a higher frequency, and the setting time of the PLL can be made shortened.

What is claimed is:

1. A frequency scanning receiver having a first local oscillator for outputting a first local oscillation signal controlled in frequency by a phase locked loop, a second local oscillator for outputting a second local oscillation signal, and a frequency discriminator so that the frequency of the first local oscillation signal output from the first local oscillator is scanned by frequency setting data fed to the phase locked loop, said frequency scanning receiver comprising:

a memory for receiving the frequency setting data and outputting a corresponding one of stored frequencies for second local oscillation signals to be output from the second local oscillator; and a controller for determining a frequency error obtained at an output of the frequency discriminator at the time of a channel selection and updating the frequency setting data for the memory on the basis of results of the determination such that the frequency error is reduced to zero.

2. The frequency scanning receiver of claim 1, including an input terminal connected to said memory and said second local oscillator to provide an external control signal that controls whether the setting of the second local oscillator signal for the second local oscillator is performed by an output of a determination circuit or by an output of the memory.

3. A frequency scanning receiver having a first local oscillator for outputting a first local oscillation signal controlled in frequency by a phase locked loop, a second local oscillator for outputting a second local oscillation signal, a third local oscillator for outputting a third local oscillation signal, and a frequency discriminator so that the frequency of the first local oscillation signal output from the first local oscillator is scanned by frequency setting data fed to the phase locked loop, said frequency scanning receiver comprising:

a memory for receiving the frequency setting data and outputting a corresponding one of stored frequencies for third local oscillation signals to be output from the third local oscillator; and a controller for determining a frequency error obtained at an output of the frequency discriminator at the time of a channel selection and updating the frequency setting data for the memory on the basis of results of the determination such that the frequency error is reduced to zero.

4. The frequency scanning receiver of claim 3, including an input terminal connected to the memory and said third local oscillator to provide an external control signal that controls whether the setting of the third local oscillator signal for the third local oscillator is performed by an output of a determination circuit or by an output of the memory.

5. The frequency scanning receiver of claim 3, wherein a reference frequency is set at a high frequency value by allocating frequencies at equal intervals, which decreases the setting time of the phase locked loop.

6. The frequency scanning receiver of claim 3, wherein a reference frequency is set at a high frequency value by allocating frequencies at equal intervals, which decreases the setting time of the phase locked loop.

7. A frequency scanning receiver circuit comprising:

a high frequency input terminal for receiving a high frequency signal;

a first frequency converter for receiving the high frequency input signal and a first local oscillation signal, the first frequency converter outputting a first frequency converter output signal;

a reference signal generator for outputting a reference signal;

a first local oscillator for receiving the reference signal and receiving a frequency setting input for scanning, said first local oscillator outputting the first local oscillation signal to the first frequency converter;

a memory for receiving the frequency setting input and receiving a controller output, the memory providing a memory output signal;

a second frequency converter for receiving the first frequency converter output signal and a second local oscillation signal, the second frequency converter outputting a second frequency converter output signal;

a frequency discriminator for receiving the second frequency converter output signal and providing an output;

a controller for determining a frequency error from the output of the frequency discriminator at the time of a channel selection, the controller providing the controller output to update the frequency setting data stored in the memory such that the frequency error is reduced to zero; and a second local oscillator for receiving the memory output signal and the controller output, the second local oscillator outputting the second local oscillation signal to the second frequency converter.

8. The frequency scanning receiving circuit of claim 7, including a control select input terminal that provides a select signal to the memory and to the second local oscillator to select the second local oscillator signal based on one of the memory output signal and the controller output.

* * * * *